United States Patent
Weling et al.

(10) Patent No.: US 6,372,522 B1
(45) Date of Patent: Apr. 16, 2002

(54) USE OF OPTIMIZED FILM STACKS FOR INCREASING ABSORPTION FOR LASER REPAIR OF FUSE LINKS

(75) Inventors: Milind Ganesh Weling; Subhas Bothra, both of San Jose; Satyendra Sethi, Pleasanton, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/631,059

(22) Filed: Aug. 1, 2000

Related U.S. Application Data

(62) Division of application No. 09/412,892, filed on Oct. 5, 1999.

(51) Int. Cl.[7] ............................................. H01L 21/00
(52) U.S. Cl. ........................................................... 438/4
(58) Field of Search ........................ 438/14, 4; 257/202, 257/204, 209, 323, 411, 413

(56) References Cited

U.S. PATENT DOCUMENTS

| | | | |
|---|---|---|---|
| 5,545,904 A | * | 8/1996 | Orbach ........................ 257/209 |
| 5,600,165 A | * | 2/1997 | Tsukamoto et al. .......... 257/323 |
| 6,061,264 A | | 5/2000 | Giust et al. .................... 365/96 |

OTHER PUBLICATIONS

Patent Abstracts of Japan vol. 007, No. 103 (E–173), May 6, 1983—& JP 58 023475 A ( Fujitsu KK), Feb, 12, 1983 abstract.

* cited by examiner

Primary Examiner—David Nelms
Assistant Examiner—Reneé R. Berry
(74) Attorney, Agent, or Firm—Wagner, Murabito & Hao LLP

(57) ABSTRACT

A system for repairable interconnect links using laser energy in a semiconductor integrated circuit die. The integrated circuit die is fabricated to include a plurality of interconnect links. At least a first and a second interconnect element are included in the integrated circuit die. The first and second interconnect elements are couple via an interconnect link. An anti-reflective layer is disposed on a surface above the interconnect link. The anti-reflective layer is configured to increase an amount of laser energy absorbed by the interconnect link in order to fuse the interconnect link, and thereby repair the integrated circuit die.

6 Claims, 5 Drawing Sheets

USE OF OPTIMIZED FILM STACKS FOR INCREASING ABSORPTION FOR LASER REPAIR OF FUSE LINKS

This is a divisional of copending application(s) Ser. No. 09/412,892 filed on Oct. 5, 1999 which designated in the U.S.

TECHNICAL FIELD

The present invention pertains to the field of integrated circuit device fabrication. More particularly, the present invention relates to a system for improving the effective yield of an integrated circuit device fabrication process through the use of selective device repair.

BACKGROUND ART

Computer systems, software applications, and the devices and processes built around them are continually growing in power and complexity. Society's reliance on such systems is likewise increasing, making it critical that the systems obey the properties their designers intended. Typically, the more powerful and complex the system, the greater its utility and usefulness. However, as these computer and software implemented systems and processes become more powerful, mass producing the systems without flaws or defects becomes increasingly difficult. For example, for a given level of process technology, as the total number of transistors fabricated within an integrate circuit die increases and the area of each fabricated die increases, the total number of fully functional dies produced from each wafer (e.g., the yield) decreases, due to he increased chance of inadvertent manufacturing defects. In addition, the collective yield for a new process technology will usually be low, with the yield increasing as the process technology matures.

For example, commonly encountered manufacturing defects include "shorts", or defects between conductive lines/elements within the IC. A short defect occurs when, for example, a contaminant particle (e.g., dust, etc.) causes extraneous metal deposit to occur across conductive lines or elements. The extraneous metal deposit electrically shorts the lines, disrupting the functionality that depends upon them. Other commonly encountered defects include "opens" that occur when, for example, a contaminant particle causes an inadvertent discontinuity during the deposition of one or more metal lines. The inadvertent discontinuity disrupts the functionality that depends upon the one or more lines.

Thus, any integrated circuit devices including defects such as shorts or opens are most likely defective, and must be discarded. Very sophisticated test programs, automatic test pattern generation (ATPG) programs, are used to analyze the various netlists representative of the integrated circuit designs. The ATPG process is designed to facilitate the detection of defective integrated circuit devices. An integrated circuit device is defective if it includes one or more defects, or flaws within its internal circuitry, which interfere with its proper functionality. The most advanced manufacturing processes produce large numbers of defective devices along with nominal devices. A typical yield for an advanced manufacturing process is, for example, 70 percent, wherein 70 percent of the fabricated devices are nominal and 30 percent of them are defective. Only the nominally performing, defect free integrated circuit devices are shipped to customers.

The problem, however, is the fact that complex integrated circuit devices are usually very expensive to fabricate. The more advanced the process technology and the larger the die, the more expensive the completed integrated circuits become. The lower the yield, the more expensive the fully functional devices become. Hence, very desirable to adjust the process to maintain as high a yield as possible. Accordingly, high performance integrated circuit device fabrication is one of the most precise and exacting manufacturing processes in existence.

The costs associated with discarding defective integrated circuit devices is prohibitive. Because of this, complex repair processes have been developed. These repair processes actually correct the defect (e.g., short, open, etc.) which impairs the functionality of the device. After a defective integrated circuit emerges from the wafer fabrication process, the nature of the defect is identified and the defect is repaired to restore functionality, thus, increasing the total yield of the manufacturing process and reducing the costs associated with each fully functional device.

Consequently, the selective repair (formation and disconnection) of interconnect links, metal lines, and the like, after the completion of wafer processing is finding rapid acceptance in certain high density applications. Such applications include, for example, high density (e.g., 1 Gb) DRAM, SRAM, logic with embedded memory, "system on a chip", smart cards, and analog and mixed signal applications.

Laser repair is one technique utilized. Laser repair involves using laser energy on a localized area (e.g., an area exposed through passivation layers) to selectively "blow" certain predetermined links. The goal of this technique, for example, is to electrically isolate the defect site. However, certain integrated circuit parameters (e.g., the thickness of the oxide layer at the localized area) can make the effectiveness of the laser energy unpredictable. For example, varying thickness of the oxide layer can modulate the effective absorption of the laser energy by the localized area, rendering the performance of laser repair somewhat variable and unreliable.

Thus, what is required is a system that yields predictable and efficient performance of selective repair of interconnect links. What is required is a system that is less susceptible to integrated circuit parameters such as oxide thickness. The present invention provides a novel solution to the above requirements.

DISCLOSURE OF THE INVENTION

The present invention provides a system that yields predictable and efficient performance of selective repair of interconnect links. Additionally, the present invention provides an interconnect repair method and system that is less susceptible to integrated circuit parameters such as oxide thickness.

In one embodiment, the present invention is implemented as a system of repairable interconnect links built into a semiconductor integrated circuit die. The repairable interconnect links are configured and optimized to facilitate repair through the use of laser energy applied to specific areas of the surface of the semiconductor integrated circuit die. The integrated circuit die is fabricated to include a plurality of interconnect links. To repair a specific defect occurring within the die (e.g., a bad memory cell due to a flaw), a specific interconnect link included in the integrated circuit die is identified. This interconnect link is selected such that the selective repair (e.g., fusing) of the link effects, for example, an isolation of the fault from the rest of the circuit, or for example, the linking in of a backup element (e.g., memory cell) to replace the faulty element.

The selected repairable interconnect link typically couples first and second interconnect elements of the integrated circuit. At the surface of the die, an anti-reflective layer is disposed above the interconnect link. The anti-reflective layer is deposited over the link during the wafer fabrication process (e.g., "just-in-case" the link needed to be fused). The anti-reflective layer is configured to increase an amount of laser energy absorbed by the interconnect link. Correspondingly, this decreases the amount of laser energy needed to be applied in order to ensure the fusing of the interconnect link. These aspects render the repair process using laser energy more deterministic and predictable, thereby improving the success rate and the overall yield of the fabrication process, and thereby repair the integrated circuit die. Additionally, the repair process is less susceptible to integrated circuit parameters such as oxide thickness above or below the interconnect link.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, the use of optimized film stacks for increasing the absorption for laser repair of fuse links, examples of which are illustrated in the accompanying drawings. While the invention will be described in conjunction with the preferred embodiments, it will be understood that they are not intended to limit the invention to the these embodiments. On the contrary, the invention is intended to cover alternatives, modifications, and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

The present invention provides a system that yields predictable and efficient performance of selective repair of interconnect links. Additionally, the present invention provides an interconnect repair method and system that is less susceptible to integrated circuit parameters such as oxide thickness. The present invention and its benefits are further described below.

The method and system of the present invention is implemented as a laser repair technique for the post-wafer processing repair of integrated circuit dies. The selective repair (formation and disconnection) of interconnect links, metal lines, and the like, after the completion of wafer processing is being increasingly used in certain high density applications. Such applications include, for example, high density (e.g., 1 Gb) DRAM, SRAM, logic with embedded memory, "system on a chip", smart cards, and analog and mixed signal applications.

Laser repair involves using laser energy on a localized area (e.g., an area exposed through passivation layers) to selectively "blow" certain predetermined links. The goal of this technique, for example, is to electrically isolate the defect site. The system of the present invention is configured to compensate for variations in certain integrated circuit parameters (e.g., the thickness of the oxide layer at the localized area), and thereby make the effectiveness of the laser energy more deterministic and predictable.

Figure 1:
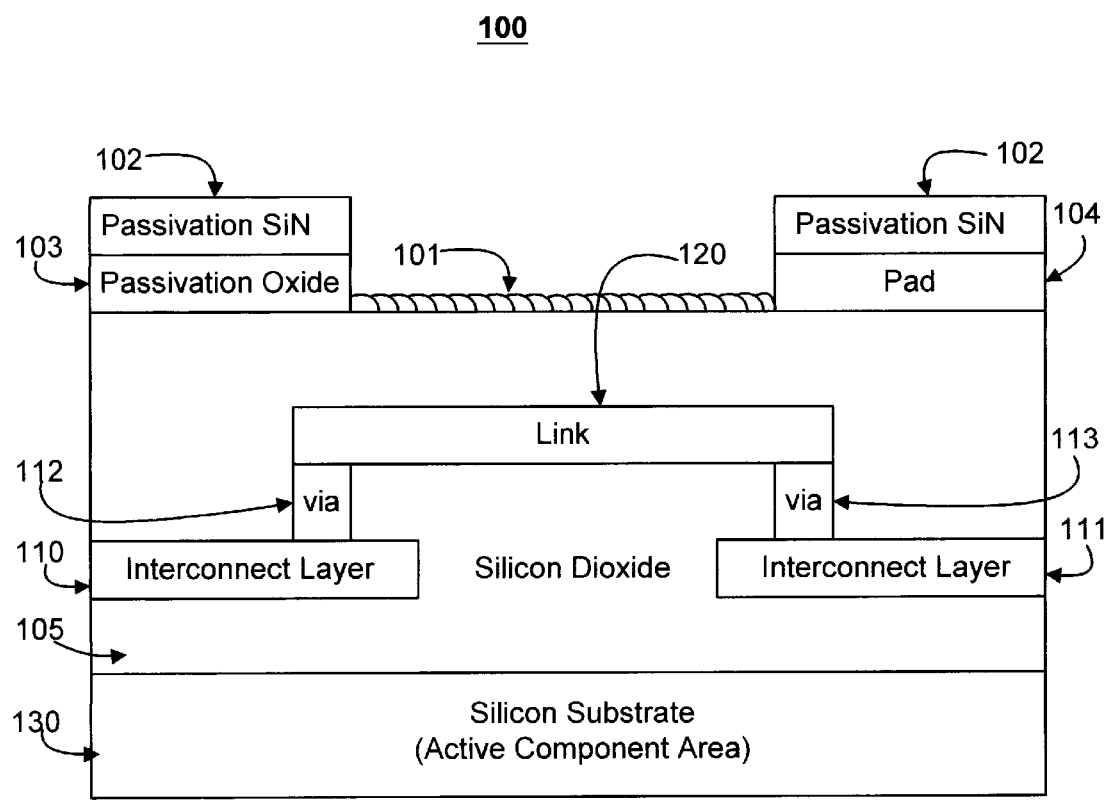
FIG. 1 shows a diagram of a portion of an integrated circuit die including a repairable interconnect link in accordance with one embodiment of the present invention.

FIG. 1 shows a diagram of a portion of an integrated circuit die 100, including a repairable interconnect link 120 in accordance with one embodiment of the present invention. As depicted, die 100 includes passivation layers 102 (Silicon Nitride), passivation oxide 103, and pad 104 over a silicon dioxide layer 105. An interconnect link 120 is fabricated into the silicon dioxide layer 105. An anti-reflective layer 101 is disposed above interconnect link 120. Interconnect link 120 couples a first interconnect layer 110 and a second interconnect layer 111 through respective vias 112–113. Silicon substrate 130 (an active component area) underlies the silicon dioxide layer 105.

The present embodiment, as described above, implements a laser repair technique for the post-wafer processing repair of integrated circuit dies (e.g., die 100). The integrated circuit die 100 is fabricated to include a plurality of interconnect links similar to interconnect link 120, wherein a respective anti-reflective layer 101 is disposed directly above. The anti-reflective layer functions by optimizing the absorption of applied laser energy by the respective interconnect link (e.g., link 120). For example, the inclusion of anti-reflective layer 101 above link 120 optimizes link 120 for repair through the use of laser energy applied to the area (e.g., the exposed area between the passivation layers 102). The applied laser energy functions by fusing (e.g., blowing open) the electrical connection of interconnect link 120.

Referring still to FIG. 1, the anti-reflective layer 101 is configured to increase an amount of laser energy absorbed by the interconnect link 120. Correspondingly, this decreases the amount of laser energy needed to be applied in order to ensure the fusing of the interconnect link 120. Additionally, the repair process is less susceptible to integrated circuit parameters such as oxide thickness above or below the interconnect link. This renders the repair process using laser energy more deterministic and predictable, thereby improving the success rate and the overall yield of the fabrication process, and thereby repair the integrated circuit die.

It should be noted that to repair a specific defect occurring within the die (e.g., a bad memory cell due to a flaw), a specific interconnect link included in the integrated circuit die needs to be identified. This interconnect link is selected such that the selective repair (e.g., fusing) of the link effects, for example, an isolation of the fault from the rest of the circuit, or for example, the linking in of a backup element (e.g., memory cell) to replace the faulty element.

Figure 2:
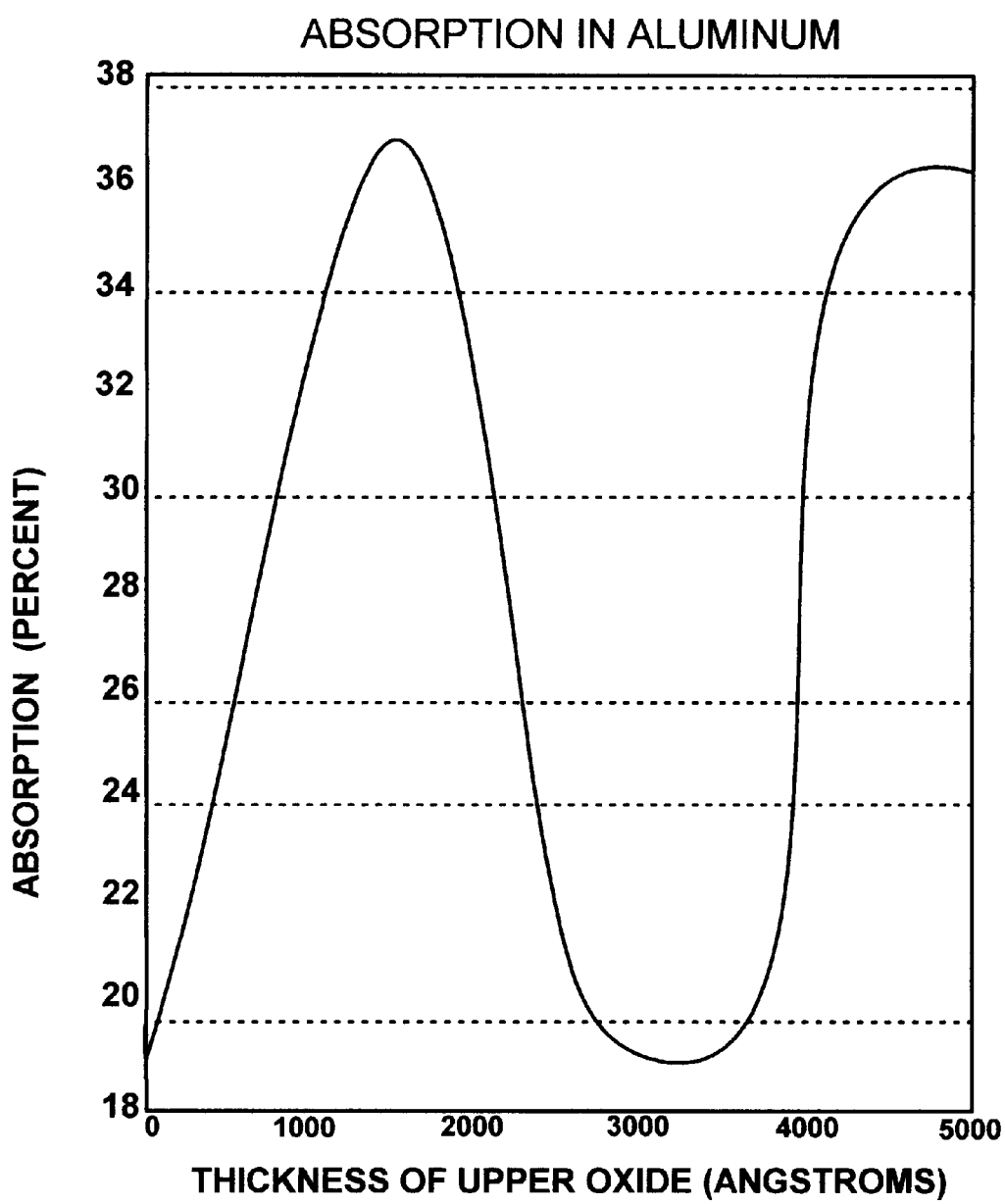
FIG. 2 shows a graph depicting the absorption of laser energy versus the thickness of an overlying oxide layer in accordance with one embodiment of the present invention.

Referring now to FIG. 2, a graph 200 showing the absorption of laser energy versus the thickness of an overlying oxide layer is depicted. The vertical axis of graph 200 shows energy absorption (e.g., in percent). The horizontal axis of graph 200 shows the thickness of the upper oxide layer (e.g., angstroms). For example, in a case where a 1047 nm laser energy source is utilized, absorption for an oxide on metal substrate is theoretically calculated as shown by the trace of graph 200.

As shown by graph 200, the percentage of laser energy absorbed (for a 1047 nm laser) various between 20 percent and 36 percent as the thickness of the upper oxide layer increases. The amount of laser energy absorbed is also closely related to the wavelength of the laser being used. These variables (e.g., nonuniform oxide thickness, percent of laser energy absorbed, and the like) must be accounted for during both the fabrication and the repair process.

The use of anti-reflective layers deposited above interconnect links (e.g., anti-reflective layer 101 above link 120 of FIG. 1) greatly increases the amount of laser energy absorbed by the respective interconnect links. The increased absorption provides for much more robust and much more deterministic repair process, less affected by process variables, such as nonuniform oxide thickness.

Figure 3:
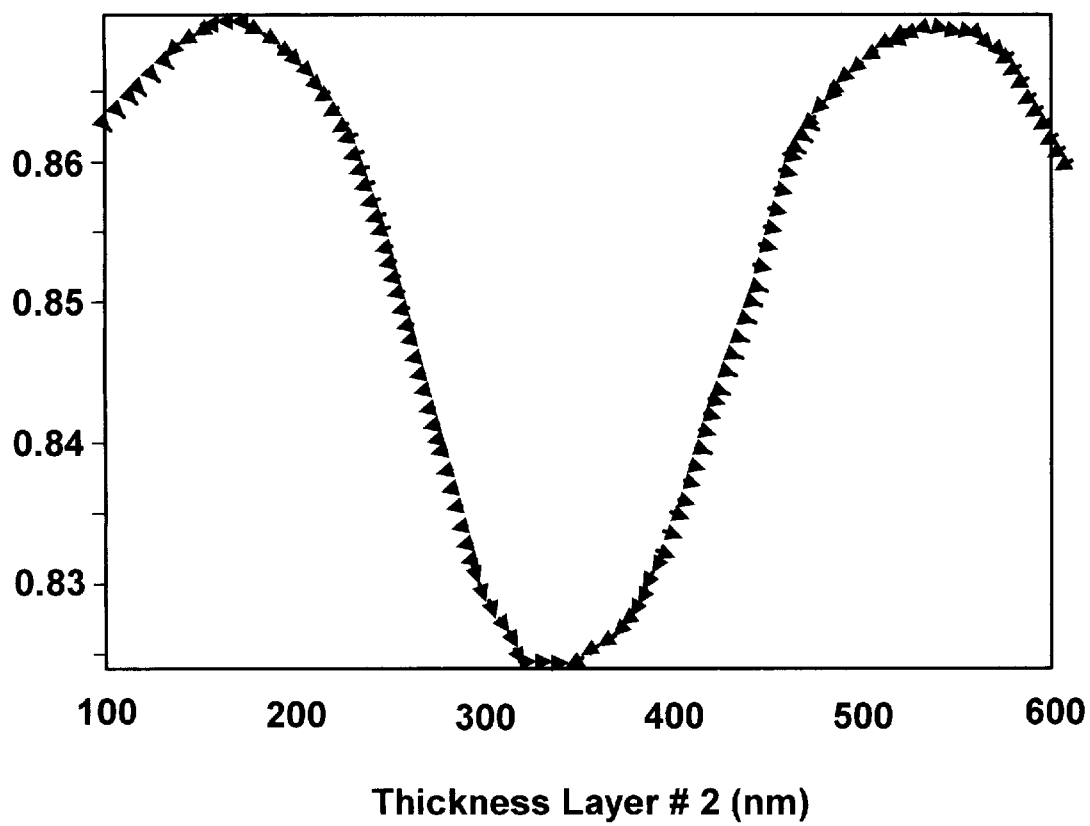
FIG. 3 shows a graph showing reflectivity versus oxide thickness for a 1047 nm laser wavelength using a variable oxide over 100 A TiN-over-AlCu stack in accordance with one embodiment of the present invention.

Referring now to FIG. 3, a graph 300 showing reflectivity versus oxide thickness for a 1047 nm laser wavelength using a variable oxide over 100 A TiN-over-AlCu stack is depicted. The vertical axis of graph 300 shows the substrate reflectivity (e.g., ranging from 0 to 1). The horizontal axis shows the thickness of the overlying oxide layer.

As shown in graph 300, varying thickness of the upper oxide layer can modulate the effective absorption of the laser energy by the localized area (e.g., the exposed area above link 120). As seen in graph 300, substrate reflectivity (e.g., a measure of the light that is not transmitted or absorbed, and therefore the inverse of absorption) is seen to be fairly high and varies between 80 and 90%, indicating less than 20% absorption. However, the incorporation of an anti-reflective layer (e.g., anti-reflective layer 101) in accordance with the present invention significantly improves the energy efficiency of the absorbed laser light and consequently the throughput of the laser energy to the link.

Figure 4:
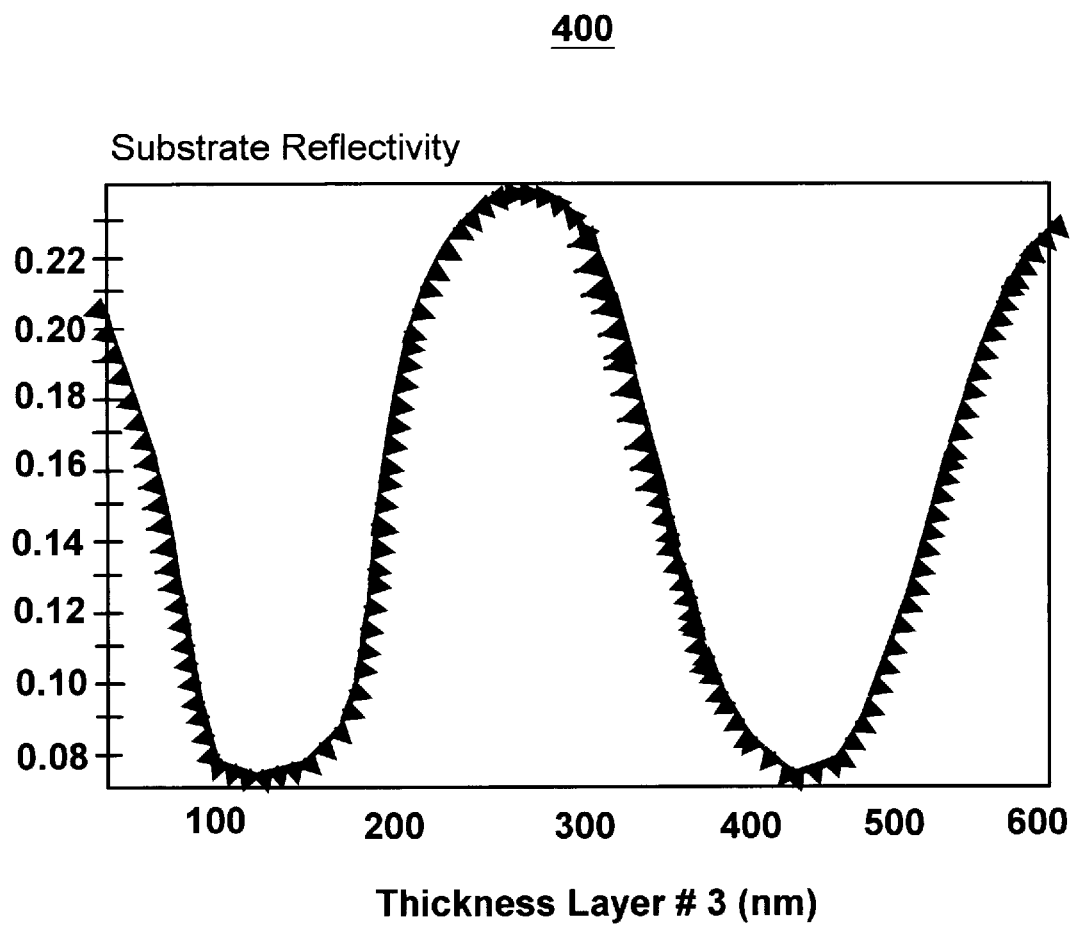
FIG. 4 shows a graph depicting reflectivity versus oxide thickness for a 1047 nm laser wavelength using a variable oxide over 100 A TiN-over-AlCu stack including an anti-reflective layer in accordance with one embodiment of the present invention.

FIG. 4 shows a graph 400 depicting reflectivity versus oxide thickness for a 1047 nm laser wavelength using a variable oxide over 100 A TiN-over-AlCu stack. Graph 400 shows reflectivity wherein an anti-reflective layer in accordance with the present invention is included. As shown in graph 400, the use of dielectric anti-reflective layer in accordance with the present invention (for example, such as Silicon Oxinitride) and optimizing the anti-reflective layer thickness can result in reflectivity being as low as 6% (and below 25%), thereby improving laser energy absorption by the link. This renders the link fusing process (e.g., the use of the absorbed laser energy to burn open link 120) less sensitive to variations in the oxide thickness. This widens the margins for the laser window etch process, wherein the etch process does not have to stop at a precise thickness of the oxide layer over the link to as much as 94%. The control of the oxide thickness as deposited on or after processing is thus not critically determined by the needs of the post-processing laser repair requirements.

Figure 5:
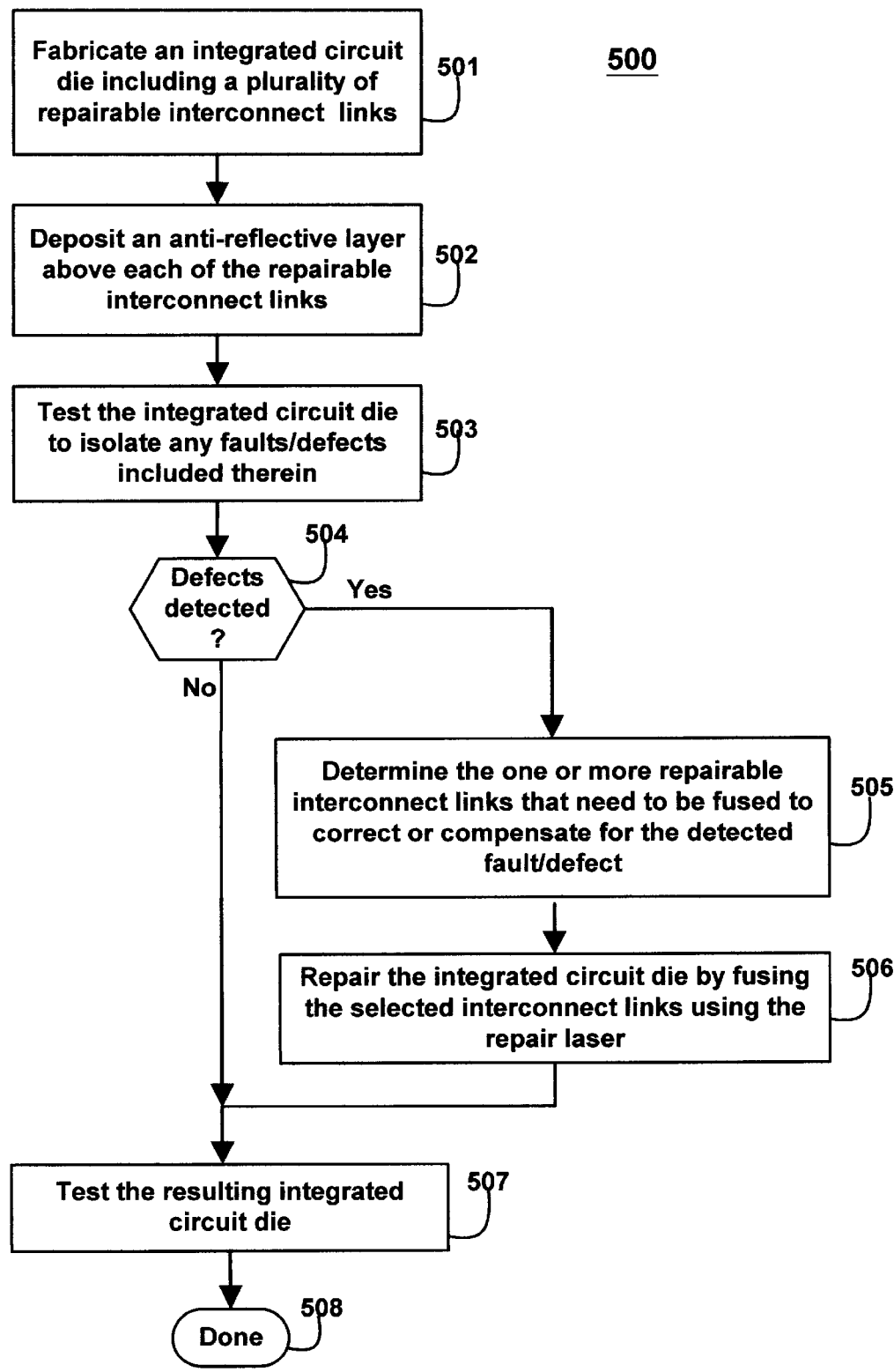
FIG. 5 shows a flow chart of the steps of a laser repair process using an anti-reflective layer in accordance with one embodiment of the present invention.

Referring now to FIG. 5, a flow chart of the steps of a laser repair process 500 in accordance with one embodiment of the present invention is shown. Process 500 depicts the steps used to fabricating integrated circuit die including a plurality of repairable interconnect links which facilitate post-fabrication processing laser repair of the die.

Process 500 begins in step 501, where an integrated circuit die is fabricated. As described above, the die in accordance with the present invention includes a plurality of repairable interconnect links (e.g., links designed to be selectively fused by a repair laser).

In step 502, and anti-reflective layer in accordance with the present invention is deposited above each of the repairable interconnect links included in the integrated circuit die. The step can be performed as a portion of the wafer fabrication process, or alternatively, can be performed after fabrication processing is largely complete.

In step 503, the completed integrated circuit die is tested to isolate any faults/defect included therein.

In step 504 and 505, where defects are detected, one or more interconnect links are selected that need to be fused to correct or compensate for the detected fault/defect. For example, a computer aided design tool determines which element needs to be isolated and determines which links need to be fused in order to accomplish this.

In step 506, the integrated circuit die is repaired by fusing the selected interconnect links using the repair laser. As described above, laser energy from the repair laser is more efficiently coupled to the interconnect link due to the action of the anti-reflective layer, making the repair process less sensitive to process variations such as varying oxide layer thickness.

In step 507, the resulting integrated circuit die is tested to ensure the defect has been corrected. Process 500 subsequently ends in step 508.

In step 504, where no defects are detected during testing in step 503, process 500 proceeds directly to step 507 and step 508.

Thus, the present invention provides a system that yields predictable and efficient performance of selective repair of interconnect links. Additionally, the present invention provides an interconnect repair method and system that is less susceptible to integrated circuit parameters such as oxide thickness.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, to thereby enable others skilled in the art best to utilize the invention and various embodiments with various modifications as are suited to the particular use contemplated. It is intended that the scope of the invention be defined by the Claims appended hereto and their equivalents.

What is claimed is:

1. In a semiconductor wafer fabrication process, a method for repairing interconnect links of a semiconductor integrated circuit die using a laser window etch process, the method comprising the steps of:

a) fabricating an integrated circuit die including a plurality of interconnect links;

b) depositing an anti-reflective layer above each of the interconnect links;

c) testing the integrated circuit die to isolate a fault detected therein; and d) repairing the integrated circuit die by fusing a selected interconnect link by directing laser energy onto the anti-reflective layer above the selected interconnect link.

2. The method of claim 1 wherein the anti-reflective layer is deposited directly above the interconnect link to decrease the reflectivity with respect to the laser energy, in comparison to an adjacent passivation layer.

3. The method of claim 1 wherein the interconnect link is fabricated within a silicon dioxide layer and the anti-reflective layer is deposited directly above the interconnect link on the surface of the silicon dioxide layer.

4. The method of claim 1 wherein the anti-reflective layer is configured to optimize absorption of laser energy from a 1047 nm laser.

5. The method of claim 1 wherein the anti-reflective layer is only above the plurality of interconnect links included in the integrated circuit die.

6. The method of claim 1 wherein the anti-reflective layer is comprised of Silicon Oxinitride.

* * * * *